United States Patent [19]

Sato et al.

[11] Patent Number: 5,610,123
[45] Date of Patent: Mar. 11, 1997

[54] METHOD OF PREPARING BISMUTH OXIDE SUPERCONDUCTOR

[75] Inventors: Kenichi Sato; Takeshi Hikata; Munetsugu Ueyama, all of Osaka, Japan

[73] Assignee: Sumitomo Electric Industries, Ltd., Japan

[21] Appl. No.: 385,240

[22] Filed: Feb. 8, 1995

Related U.S. Application Data

[63] Continuation of Ser. No. 123,594, Sep. 20, 1993, abandoned, which is a continuation of Ser. No. 976,306, Nov. 13, 1992, abandoned, which is a continuation of Ser. No. 675,221, Mar. 26, 1991, abandoned.

[30] Foreign Application Priority Data

| Mar. 26, 1990 | [JP] | Japan | 2-77467 |
| Apr. 18, 1990 | [JP] | Japan | 2-104304 |
| Jan. 31, 1991 | [JP] | Japan | 3-011127 |

[51] Int. Cl.$^6$ ............................................ H01L 39/24
[52] U.S. Cl. .................. 505/433; 505/492; 505/501; 505/782; 505/928; 29/599
[58] Field of Search ............................. 29/599; 505/430, 505/433, 492, 501, 782, 928

[56] References Cited

U.S. PATENT DOCUMENTS

| 5,004,722 | 4/1991 | Tallman | 29/599 X |
| 5,057,486 | 10/1991 | Arendt et al. | 505/1 |

FOREIGN PATENT DOCUMENTS

| 0357779 | 3/1990 | European Pat. Off. |
| 0379960 | 8/1990 | European Pat. Off. |
| 9004856 | 5/1990 | WIPO |

OTHER PUBLICATIONS

D. Shi et al., "Lattice deflects and flux pinning in crystallized metal–oxide glasses in the Bi–Sr–Ca–Cu–O system", Applied Physics Letters, vol. 55, No. 13, 25 Sep. 1989, New York US pp. 1354–1356.

H. Sekine et al., "Fabrication of Bi–(Pb)–Sr–Ca–Cu–O mono–and multifilamentary superconductors and improvement in critical current density", Journal Of Applied Physics, vol. 66, No. 6, 15 Sep. 1989, New York, pp. 2762–2764.

T. Hikata et al., "Electromagnetic properties and morphology of Ag–sheathed Bi–Pb–Sr–Ca–Cu–O superconducting wires", Japanese Journal Of Applied Physics Letters, vol. 28, No. 7, Jul. 1989, Tokyo JP, pp. 1204–1206.

"Critical Current Density In Superconducting Bi–Pb–Sr–Ca–Cu–O Wires and Coils", Dou et al., Nov. 16, 1989.

*Primary Examiner*—Joseph M. Gorski
*Attorney, Agent, or Firm*—Pennie & Edmonds

[57] ABSTRACT

In a method of preparing a bismuth oxide superconducting wire comprising the steps of filling raw material powder into a metal sheath, working the same into a wire by performing deformation processing in this state, and heat treating the wire, the raw material powder is heat treated before the step of working the raw material powder into a wire by performing deformation processing, so that the ratio of a 2212 phase, containing Bi or (Bi,Pb), Sr, Ca and Cu in composition ratios of about 2:2:1:2, to a 2223 phase, containing Bi or (Bi,Pb), Sr, Ca and Cu in composition ratios of about 2:2:2:3, is 75 to 90:10 to 25, in order to prepare a wire which is excellent in critical current density as well as in critical current.

11 Claims, No Drawings

METHOD OF PREPARING BISMUTH OXIDE SUPERCONDUCTOR

This application is a continuation of U.S. application Ser. No. 08/123,594, filed on Sep. 20, 1993, and now abandoned, which is a continuation of U.S. application Ser. No. 07/976, 306, filed on Nov. 13, 1992 and now abandoned, which in turn is a continuation of U.S. application Ser. No. 07/675, 221, filed on Mar. 26, 1991 and now abandoned.

BACKGROUND OF THE INVENTION

1. Field of the Invention

The present invention relates to a method of preparing a bismuth oxide superconductor, and more particularly, it relates to a method of preparing a bismuth oxide superconductor, which can improve a magnetic field property of critical current density.

2. Description of the Background Art

In recent years, superconducting materials of ceramics, i.e., oxide superconducting materials, are watched as materials which exhibit higher critical temperatures.

For example, a bismuth oxide superconducting material, which exhibits a high critical temperature of about 110K, is expected as a practicable superconducting material.

It is known that a bismuth oxide superconductor has a phase showing a critical temperature of 110K and those showing critical temperatures of 80K and 10K. It is also known that a non-superconducting phase inevitably partially appears particularly when a 110K phase is to be formed.

In relation to such a bismuth oxide superconductor, it is further known that a 110K phase has a 2223 composition in a composition of Bi—Sr—Ca—Cu, or (Bi,Pb)—Sr—Ca—Cu with partial substitution of Pb for Bi, while a 80K phase has a 2212 composition in the same composition.

In a method of preparing an oxide superconductor, a raw material for the superconductor is filled into a metal sheath and subjected to deformation processing and heat treatment, so that the raw material, covered with the metal sheath, is brought into a superconducting state. This method is advantageously applied to preparation of a long superconducting wire, for example.

In relation to the above case, it has been recognized that the critical current density of the oxide superconductor can be improved by performing deformation processing at a high draft and repeating such deformation processing and heat treatment a plurality of times.

In order to stably use a bismuth oxide superconductor with a cooling medium of inexpensive liquid nitrogen (77.3K), it is preferable to form a 2223 phase, which is a 110K phase, as much as possible.

When a superconductor is actually applied to a superconducting wire, for example, the same must be capable of providing not only a high critical current density but also a high critical current. In order to simply attain a high critical current, for example, the thickness of the superconductor may be increased. In this case, however, the critical current density remains at a low level since the draft in the aforementioned deformation processing cannot be desirably increased and the critical current density cannot be effectively improved by the deformation processing. If the critical current density is at a low level, the same is further reduced under an external magnetic field even if the magnetic field is low. Thus, it is impossible to attain a high critical current density under the magnetic field.

Further, the critical current density of an oxide superconductor such as a bismuth oxide superconductor is generally significantly reduced when a magnetic field is applied thereto.

SUMMARY OF THE INVENTION

Accordingly, an object of the present invention is to provide a method of preparing a bismuth oxide superconductor, which can promote formation of a 2223 phase, i.e., a 110K phase, while attaining a high critical current density as well as a high critical current.

Another object of the present invention is to provide a method of preparing a bismuth oxide superconductor, which can improve a critical current density under a magnetic field.

The present invention is directed to a method of preparing a bismuth oxide superconductor by forming a 2223 phase having a 2223 composition in a composition of Bi—Sr—Ca—Cu or (Bi,Pb)—Sr—Ca—Cu in a metal sheath. In order to solve the aforementioned technical problems, the inventive method comprises the steps of:

preparing a raw material containing a superconducting phase, mainly consisting of a 2212 phase having a 2212 composition in the above composition with partial formation of a 2223 phase, and non-superconducting phases mixed therewith;

pulverizing the raw material;

filling the pulverized raw material into a metal sheath; and performing deformation processing and heat treatment on the metal sheath which is filled with the raw material.

It has been found that, when non-superconducting phases are extremely finely dispersed along a 2223 phase, which is a superconducting phase, in a bismuth oxide superconductor, the magnetic field property of critical current density is remarkably improved by such non-superconducting phases. On the basis of such recognition, the present invention aims at providing a method of preparing a bismuth oxide superconductor having the aforementioned structure.

According to the present invention, a 2223 phase is partially formed in a raw material containing a superconducting phase mainly consisting of a 2212 phase and non-superconducting phases mixed therewith before the same is filled into a metal sheath, and then the raw material is pulverized, in order to simultaneously attain an object of forming a 2223 phase in the metal sheath and another object of dispersing fine phases, serving as pinning sites, therein. The partially formed 2223 phase conceivably serves as a catalyst for growing a 2223 phase in the metal sheath. Upon formation of such a catalyst, the raw material is finely pulverized to refine the 2212 phase, which serves as a main superconducting phase, the 2223 phase, which serves as a catalyst, and the non-superconducting phases. The as-formed powder is filled into the metal sheath and subjected to deformation processing and heat treatment in this state, whereby a 2223 phase can be homogeneously grown in the metal sheath and the non-superconducting phases can be finely dispersed. Thus, phase transformation and grain growth are simultaneously carried out, so that the 2223 phase can be grown to crystals of tens of microns.

Thus, according to the present invention, it is possible to efficiently prepare a bismuth oxide superconductor containing a 2223 phase whose a-b plane is oriented in the longitudinal direction and non-superconducting phases which are finely dispersed in the 2223 phase. Therefore, the magnetic field property of critical current density is extremely improved in the as formed bismuth oxide superconductor due to the dispersed non-superconducting phases, as hereinabove described. Thus, it is possible to apply such a bismuth oxide superconductor to a cable or a magnet with no problem.

According to the present invention, formation of a 2223 phase, which is a 110K phase, is promoted in heat treatment, whereby it is possible to obtain a bismuth oxide superconductor which exhibits a high critical current and a high critical current density.

In the present invention, the superconducting phase provided in the raw material preferably contains a 2212 phase and a 2212 phase in a ratio of 75 to 90, i.e. a 2223 phase in a ratio of 10 to 25.

In the present invention, further, the raw material is preferably degassed before the same is filled into the metal sheath, so that the metal sheath is not inflated by gas desorption during heat treatment and the superconductor contained in the metal sheath can be prevented from cracking etc. Thus, it is possible to obtain a superconductor, which has substantially uniform superconducting properties over the entire length.

Such degassing is preferably performed under a decompressed atmosphere through heat treatment at a high temperature in a short time.

The heat treatment is preferably performed after the deformation processing, in order to maintain a preferable crystal structure of the as-formed bismuth oxide superconductor.

The step of performing deformation processing and heat treatment is preferably repeated a plurality of times, in order to improve the critical current density.

The heat treatment is preferably performed in an air current.

The powder of the raw material, which is filled into the metal sheath, is preferably not more than 2.0 μm in maximum particle diameter and not more than 1.0 μm in mean particle diameter, in order to enable fine dispersion of the non-superconducting phases in the as-formed oxide superconductor.

The metal sheath is preferably formed of a low-resistance metal or alloy, which is not reactive with the bismuth oxide superconductor.

DESCRIPTION OF THE PREFERRED EMBODIMENTS

In order to carry out the method of preparing a bismuth oxide superconductor according to the present invention, first prepared is a raw material which contains a superconducting phase, mainly consisting of a 2212 phase having a 2212 composition in a composition of Bi—Sr—Ca—Cu or (Bi,Pb)—Sr—Ca—Cu, and a non-superconducting phases mixed therewith. 10 to 25% of a 2223 phase is partially formed in the superconducting phase contained in the raw material.

Then, the raw material is pulverized, preferably into a submicron particle size, with a wet ball mill, a dry ball mill, an attriter, or the like.

The non-superconducting phases may have a composition of Sr—Ca—Cu—O, (Ca,Sr)—Pb—O, Ca—Cu—O, or the like. Such a non-superconducting phases are simultaneously (i.e., in-situ) formed with formation of the 2223 phase, and can enter a dispersed state by itself.

Then, the pulverized raw material powder is degassed before the same is filled into a metal sheath. Such degassing is performed by heat treatment at a high temperature in a short time, preferably under a decompressed atmosphere. For example, proper heat treatment is performed at a temperature of 600° to 850° C. for about 5 minutes to 3 hours.

Then the degassed raw material powder is filled into a metal sheath. The metal sheath may be formed of any material, so far as the same is not reactive with the superconducting material and has excellent workability. Such a material may be prepared from silver, a silver alloy, gold or a gold alloy, for example. Alternatively, only a surface, which is brought into contact with the superconducting material, of the metal sheath may be covered with a layer of such a metal. The metal sheath preferably serves as a stabilizer under conditions for using the superconductor.

The metal sheath thus filled with the raw material is subjected to deformation processing and heat treatment. The temperature for such heat treatment cannot be univocally determined since the optimum temperature level is selected in relation to the heat treatment atmosphere. When the oxygen partial pressure of the heat treatment atmosphere is reduced, for example, temperature control is easy since the 2223 phase can be formed in a wide temperature range. While the heat treatment atmosphere may be prepared from ordinary atmospheric air, the heat treatment is preferably performed in a flowing atmosphere having the same components as the ordinary atmospheric air. In particular, it is preferable to reduce the moisture content in the heat treatment atmosphere.

The deformation processing includes drawing and rolling, for example. In order to improve the critical current density, the deformation ratio is preferably at least 80% in drawing as well as in rolling. The step of performing such deformation processing and heat treatment is preferably repeated a plurality of times, in order to further effectively improve the critical current density. When rolling is performed a plurality of times, the deformation ratio in a single pass is preferably at least 40%. If rolling or drawing is again performed after the heat treatment, the deformation ratio in such processing may be 10 to 30%. The rolling is performed with a roll or a press, for example.

Experimental Examples carried out on the basis of the present invention are now described.

EXPERIMENTAL EXAMPLE 1

$Bi_2O_3$, PbO, $SrCO_3$, $CaCO_3$ and CuO were blended so that Bi, Pb, Sr, Ca and Cu were in composition ratios of 1.81:0.40:1.98:2.20:3.01. This blend was heat treated at 700° C. for 8 hours and at 800° C. for 10 hours in the atmospheric air, and then at 760° C. for 8 hours in a decompressed atmosphere of 1Torr, in this order. The blend was pulverized after each heat treatment.

The as-formed powder was further heat treated at 845° C. for 12 hours. Thus obtained was a raw material containing a 2212 phase with about 10% of a 2223 phase and non-superconducting phases. The raw material was pulverized with a wet ball mill, to obtain submicron powder. The submicron powder was degassed in a decompressed atmosphere at 800° C. for 10 minutes.

The as-formed raw material powder was filled into a silver pipe of 12 mm in diameter (outer diameter), which in turn was drawn into 1 mm in diameter, and then rolled into 0.18 mm in thickness.

The as-formed tape-type wire was heat treated at 848° C. for 50 hours, again rolled into 0.13 mm in thickness, and thereafter heat treated at 843° C. for 50 hours.

The tape-type wire exhibited a critical current density of 45000 A/cm$^2$ in liquid nitrogen with application of no external magnetic field. When a magnetic field of 0.5 T was applied, the wire exhibited a critical current density of 24000 A/cm$^2$.

EXPERIMENTAL EXAMPLE 2

$Bi_2O_3$, PbO, $SrCO_3$, $CaCO_3$ and CuO were blended so that Bi, Pb, Sr, Ca and Cu were in composition ratios of 1.83:0.42:1.99:2.22:3.03. This blend was heat treated at 700° C. for 8 hours and at 800° C. for 10 hours in the atmospheric air, and at 760° C. for 8 hours in a decompressed atmosphere of 1 Torr, in this order. The blend was pulverized after each heat treatment.

The as-formed powder was further heat treated at 845° C. for 12 hours. Thus obtained was a raw material containing a 2212 phase with about 10% of a 2223 phase and non-superconducting phases. The raw material was pulverized with a wet ball mill, to obtain submicron powder. The submicron powder was degassed at 700° C. for 40 minutes in a decompressed atmosphere of 8 Torr.

The raw material powder was filled into a silver pipe of 12 mm in diameter (outer diameter), which in turn was drawn into 1 mm in diameter, and further rolled into 0.16 mm in thickness.

The as-formed tape-type wire was heat treated at 850° C. for 65 hours in the atmospheric air.

The tape-type wire exhibited a critical current density of 22000 A/cm$^2$ in liquid nitrogen. Thus, it has been recognized that a high critical current density can be obtained through a single heat treatment step.

EXPERIMENTAL EXAMPLE 3

$Bi_2O_3$, PbO, $SrCO_3$, $CaCO_3$ and CuO were blended so that Bi, Pb, Sr, Ca and Cu were in composition ratios of 1.77:0.45:1.96:2.17:2.89. This blend was heat treated at 710° C. for 10 hours and 820° C. for 12 hours in the atmospheric air, and at 750° C. for 10 hours in a decompressed atmosphere of 1 Torr, in this order. The blend was pulverized after each heat treatment.

The as-formed powder was further heat treated at 845° C. for 14 hours. Thus obtained was raw material powder containing a 2212 phase with about 10% of a 2223 phase and non-superconducting phases. The raw material powder was pulverized with a dry ball mill, to obtain powder having a submicron mean particle diameter.

The powder was degassed at 700° C. for one hour in a decompressed atmosphere of 8 Torr.

The raw material powder was filled into a silver pipe of 6 mm in diameter (outer diameter), which in turn was drawn into 1 mm in diameter, and further rolled into 0.16 mm in thickness.

The as-formed tape-type wire was heat treated at 850° C. for 55 hours, in an air current containing oxygen and nitrogen in a ratio of 1:4.

The tape-type wire exhibited a critical current density of 26000 A/cm$^2$ in liquid nitrogen. Thus, it has been recognized that a high critical current density can be obtained through a single heat treatment step.

EXPERIMENTAL EXAMPLE 4

An operation similar to that of Example 2 was carried out up to the step of filling raw material powder into a silver pipe. The silver pipe of 12 mm in diameter (outer diameter), filled up with the raw material powder, was drawn into 0.7 mm in diameter.

The as-formed wire, having a circular section, was heat treated at 850° C. for 60 hours in an air current containing oxygen and nitrogen in a ratio of 1:4.

The wire having a circular section exhibited a critical current density of 18000 A/cm$^2$ at the liquid nitrogen temperature. Thus, it has been recognized that a high critical current density can be attained with no rolling, through a single heat treatment.

EXPERIMENTAL EXAMPLE 5

The wire, having a circular section, obtained in Experimental Example 4 was further rolled into 0.13 mm in thickness.

The as-formed tape-type wire was heat treated at 840° C. for 50 hours in the atmospheric air.

The tape-type wire exhibited a critical current density of 38000 A/cm$^2$ in liquid nitrogen. Thus, it was possible to further improve superconductivity.

EXPERIMENTAL EXAMPLE 6

Powder materials of $Bi_2O_3$, PbO, $SrCO_3$, $CaCO_3$ and Cu were weighed and mixed with each other so that Bi, Pb, Sr, Ca and Cu were in ratios of 1.8:0.4:2.0:2.2:3.0.

The mixture was heat treated at 800° C. for 8 hours, and the as-formed powder was equally divided into three samples.

The first one of the three samples was heat treated at 860° C. for 20 hours, to obtain powder containing a 2212 phase and a 2223 phase in a ratio of 60:40 (sample No. 1).

The second sample was heat treated at 860° C. for 5 hours, to obtain powder containing a 2212 phase and a 2223 phase in a ratio of 83:17 (sample No. 2).

The third sample was heat treated at 860° C. for one hour, to obtain powder containing a 2212 phase and a 2223 phase in a ratio of 95:5 (sample No. 3).

These samples were pulverized to be 1.8 μm in maximum particle diameter and 0.8 μm in mean particle diameter respectively.

Thereafter the samples were filled into silver pipes of 6.0 mm in outer diameter and 4.0 mm in inner diameter, which in turn were drawn into 1.0 mm in diameter, rolled into 0.3 mm in thickness, heat treated at 845° C. for 50 hours, further rolled into 0.15 mm in thickness, and again heat treated at 845° C. for 50 hours.

The as-formed wires were subjected to measurement of critical-currents and critical current densities in zero magnetic fields under the temperature of 77.3K respectively.

As the result, the sample No. 1 exhibited a critical current of 22 A and a critical current density of 18000 A/cm$^2$, the sample No. 2 exhibited a critical current of 48 A and a critical current density of 40000 A/cm$^2$, and the sample No. 3 exhibited a critical current of 24 A and a critical current density of 20000 A/cm$^2$.

Thus, the oxide superconducting wire of the sample No. 2, satisfying the condition that the ratio of the 2212 phase to the 2223 phase is 75 to 90:10 to 25, attained higher critical current and critical current density as compared with the other samples.

What is claimed is:

1. A method of preparing a bismuth oxide superconducting wire, comprising the steps of:

preparing a raw material in a composition of Bi, Sr, Ca, and Cu having a superconducting phase and non-superconducting phases mixed therein, wherein said superconducting phase of said raw material contains from about 75 to about 90 percent of a 2212 phase and from about 10 to about 25 percent of a 2223 phase;

pulverizing said raw material;

filling said pulverized raw material into a metal sheath; and performing deformation processing and heat treatment on said metal sheath and pulverized raw material, thereby forming a superconductor having a non-superconducting phase which is finely dispersed in the superconducting phase.

2. A method of preparing a bismuth oxide superconductor in accordance with claim 1, further comprising a step of degassing said raw material between said step of pulverizing said raw material and said step of filling said raw material into a metal sheath.

3. A method of preparing a bismuth oxide superconductor in accordance with claim 2, wherein said degassing is performed by heat treatment at a temperature of from about 600° to about 850° C. for about 5 minutes to about 3 hours.

4. A method of preparing a bismuth oxide superconductor in accordance with claim 2, wherein said degassing is performed by heat treatment under a decompressed atmosphere.

5. A method of preparing a bismuth oxide superconductor in accordance with claim 1, wherein said heat treatment is performed after said deformation processing.

6. A method of preparing a bismuth oxide superconductor in accordance with claim 1, wherein said step of performing deformation processing and heat treatment is repeated a plurality of times.

7. A method of preparing a bismuth oxide superconductor in accordance with claim 1, wherein said heat treatment is performed in a flowing atmosphere.

8. A method of preparing a bismuth oxide superconductor in accordance with claim 1, wherein powder of said raw material being filled into said metal sheath is not more than 2.0 µm in maximum particle diameter and not more than 1.0 µm in mean particle diameter.

9. A method of preparing a bismuth oxide superconductor in accordance with claim 1, wherein said metal sheath is formed of a low-resistance metal which is not reactive with said bismuth oxide superconductor.

10. A method of preparing a bismuth oxide superconductor in accordance with claim 1, wherein said metal sheath is formed of a low-resistance alloy which is not reactive with said bismuth oxide superconductor.

11. A method of preparing a bismuth oxide superconducting wire, comprising the steps of:

preparing a raw material in a composition of Bi, Sr, Ca, and Cu containing a superconducting phase consisting of a 2212 phase, a 2223 phase, and non-superconducting phases mixed therein, wherein said superconducting phase of said raw material contains from about 75 to about 90 percent of a 2212 phase and from about 10 to about 25 percent of a 2223 phase;

pulverizing said raw material; degassing said raw material;

filling said pulverized raw material into a metal sheath; and performing deformation processing and heat treatment on said metal sheath and pulverized raw material, thereby forming a superconductor having a non-superconducting phase which is finely dispersed in the superconducting phase; wherein said degassing step is performed before the deformation and heat treating steps.

* * * * *